US007327207B2

(12) United States Patent
Asakawa

(10) Patent No.: US 7,327,207 B2
(45) Date of Patent: Feb. 5, 2008

(54) LAMINATION TYPE ELECTRONIC COMPONENT

(75) Inventor: Keiji Asakawa, Fukui (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 200 days.

(21) Appl. No.: 11/143,281

(22) Filed: Jun. 2, 2005

(65) Prior Publication Data

US 2006/0022770 A1 Feb. 2, 2006

(30) Foreign Application Priority Data

Aug. 2, 2004 (JP) ............................ 2004-225766

(51) Int. Cl.
*H03H 7/01* (2006.01)
*H01F 27/28* (2006.01)
*H01F 5/00* (2006.01)

(52) U.S. Cl. ...................... 333/175; 333/185; 336/183; 336/200; 336/223; 336/232

(58) Field of Classification Search .................. 336/83, 336/183, 200, 232
See application file for complete search history.

(56) References Cited

U.S. PATENT DOCUMENTS 6,661,325 B2 * 12/2003 Suh et al. .................. 336/200
6,959,482 B2 * 11/2005 Liang et al. ............... 29/602.1
7,046,114 B2 * 5/2006 Sakata ........................ 336/200

FOREIGN PATENT DOCUMENTS

JP 2002-064016 2/2002

* cited by examiner

*Primary Examiner*—Robert Pascal
*Assistant Examiner*—Kimberly E Glenn
(74) *Attorney, Agent, or Firm*—Keating & Bennett, LLP

(57) ABSTRACT

A lamination type electronic component includes spiral conductor patterns which are substantially quadrilateral and are electrically connected to each other through a via hole formed in a ceramic insulating layer so as to constitute a coil. The conductor patterns are arranged so that the center in the width direction of the sides extending in the Y-axis direction of the one conductor pattern may be positioned at the inside edges of the sides extending in the Y-axis direction of the other conductor pattern.

5 Claims, 10 Drawing Sheets

LAMINATION TYPE ELECTRONIC COMPONENT

BACKGROUND OF THE INVENTION

1. Field of the Invention

The present invention relates a lamination type electronic component and more particularly, to a lamination type electronic component of an LC filter having a coil disposed inside a laminate made up of laminated insulating layers of ceramic, etc.

2. Description of the Related Art

Up to now, for example, a laminated inductor disclosed in Japanese Unexamined Patent Application Publication No. 2002-64016 is known among such lamination type electronic components. In the laminated inductor, ceramic insulating layers and conductor patterns are alternately laminated, the conductor patterns are stacked one upon another in the lamination direction of the ceramic insulation layers by connecting the end portion of each conductor pattern in order, and a coil in which the direction of the coil axis is in the lamination direction of the ceramic insulating layers is formed within a chip-type ceramic laminate.

In the related lamination type electronic component, when seen from the lamination direction of the ceramic insulating layers, the adjacent conductor patterns are arranged so as to lie one upon the other with a ceramic insulating layer therebetween. In this way, when the conductor patterns adjacent each other are formed so as to lie upon the other with a ceramic insulating layer therebetween, if the ceramic insulating layer is displaced in the lamination of the ceramic insulating layer and the conductor patterns, the opposing area between the adjacent conductor patterns facing each other changes to cause the change of inductance of the coil, and, as a result, the electrical characteristics of the lamination type ceramic electronic component change.

For example, in a LC filter having a capacitor contained in addition to a coil where the conductor patterns are connected in order inside a chip-type ceramic laminate, there is a problem in that the inductance of the coil changes by a change of the facing area between conductor patterns and the frequency of the attenuation pole of the filter changes. Moreover, the lamination displacement inevitably occurs.

In order to solve such a problem contained in the related lamination type ceramic electronic component, for example, as shown in FIG. 10, in an LC filter having quadrilateral spiral conductor patterns 31 and 32 disposed adjacent to each other with a ceramic insulating layer therebetween and having a quadrilateral spiral coil (inductor) L in which the end portions 31*a* and 32*a* of the conductor patterns 31 and 32 are electrically connected through a via hole vh formed in the ceramic insulating layer 30, it is considered to form the width of the conductor pattern 31, out of the conductor patterns 31 and 32, narrower than the width of the other conductor pattern 32 and to form the conductor pattern 31 located substantially in the middle in the width direction of the conductor pattern 32. When constructed in this way, even if there are slight variations in location of the conductor patterns 31 and 32 adjacent to each other having the ceramic insulating layer therebetween, the opposing area between the facing conductor patterns 31 and 32 is kept constant.

However, when lamination displacement occurs, for example, as shown in FIG. 10, when the conductor pattern 31 is displaced in the amount of ΔX in the X-axis direction from the conductor pattern 32, a pair of sides 31*ya* and 31*yb* extending in the Y-axis direction of the conductor pattern 31 is also shifted in the amount of ΔX in the X-axis direction from a pair of sides 32*ya* and 32*yb* extending in the Y-axis direction of the conductor pattern 32. Because of this shift, the space between the inside edge $e_{1a}$, of the coil L, of the side 31*ya* of the conductor pattern 31 and the inside edge $e_{2a}$, of the coil L, of the side 32*ya* of the conductor pattern 32 is reduced from g to (g−ΔX), and simultaneously, the space between the outer edge $e_{1b}$, of the coil L, of the side 31*yb* of the conductor pattern 31 and the outer edge $e_{2b}$, of the coil L, of the side 32*yb* of the conductor pattern 32 is also reduced from g to (g−ΔX).

Now, as shown in FIG. 10, in the case where the conductor patterns 31 and 32 are stacked on each other, when the conductor pattern 31 is displaced from the conductor pattern 32, even if displacement occurs where the overlapping width does not change, since the coupling of electric lines of force due to the edge effect is reduced, the inductance value of the coil L decreases.

An edge effect means that the electric lines of force are produced at an edge portion of an electrode so as to spread out. When the coupling between layers of a coil pattern is considered, the electric lines of force from the conductor pattern 31 produced by an edge effect are received by the protruded portion of the conductor pattern 32. However, when the distance between the edges $e_{2a}$ and $e_{1a}$, and $e_{2b}$ and $e_{1b}$ is reduced, the electric lines of force received by the edges $e_{2a}$ and $e_{2b}$ are reduced. Because of this, the inductance value of the coil L is also reduced. Therefore, when the location of the conductor patterns 31 and 32 is varied, the distance between the edges $e_{2a}$ and $e_{1a}$, and $e_{2b}$ and $e_{1b}$ is also varied and, as a result, there is a problem in that the inductance value of the coil L is also varied.

SUMMARY OF THE INVENTION

In order to overcome the problems described above, preferred embodiments of the present invention provide a lamination type electronic component in which disposition of the conductor patterns constituting a coil is planned and, even if slight displacement is caused between the adjacent conductor patterns in the lamination direction, variations in the inductance value of the coil are prevented and variations in electrical characteristics are minimized.

A lamination type electronic component according to a preferred embodiment of the present invention includes a laminate having insulating layers laminated on each other in a lamination direction, and a coil having a coil axis extending in the lamination direction of the insulating layers, with the coil being disposed inside the laminate. In the lamination type electronic component, the coil includes conductor patterns having symmetrical axes that are substantially perpendicular to each other disposed on the main surfaces of the insulating layers of the laminate and a via hole formed in an insulating layer located between conductor patterns that are adjacent to each other in the lamination direction of the insulating layers, the via hole connecting the conductor patterns in series, and the conductor patterns that are adjacent to each other are arranged so that, when seen in the lamination direction of the insulating layers, one conductor pattern may be put on the inside edge or outside edge of another conductor pattern.

According to the lamination type electronic component of this preferred embodiment of the present invention, since adjacent conductor patterns in the lamination direction are arranged so that one conductor pattern may overlap with the inside edge or the outside edge of the other conductor pattern, even if a conductor pattern is shifted from the adjacent conductor pattern with an insulating layer therebetween, the area of the actually overlapping portion becomes constant. That is, when the overlapping width of a pair of opposing sides increases on one hand, the overlapping width of a pair of sides decreases on the other hand so as to cancel each other. Then, the coupling of electric lines of force due to the edge effect is reduced only on one side. In the related lamination type electronic component shown in FIG. 10, the coupling of electric lines of force due to the edge effect is reduced on both sides, but, in the lamination type electronic component of preferred embodiments of the present invention, the reduction occurs only on one side, and accordingly, the change of inductance value of the coil becomes smaller. As a result, in the lamination type electronic component of preferred embodiments of the present invention, variations of electric characteristics are minimized.

In a lamination type electronic component of preferred embodiments of the present invention, the width of conductor patterns that are adjacent to each other in the lamination direction of the insulating layers may be different from each other. Since the distance between the edges of conductor patterns that are adjacent to each other in the lamination direction of the insulating layers increases, the allowable range of shifting of the conductor pattern can be increased, and it becomes easier to control shifting of lamination.

Furthermore, the overlapping width between conductor patterns that are adjacent to each other in the lamination direction of the insulating layers may be substantially a half the width of the conductor pattern which is narrower in width. Since deviation of the conductor pattern is allowed up to substantially one half of the conductor pattern having a narrower width at maximum, the allowable range of deviation of the conductor pattern can be maximized and shifting of lamination can be more easily controlled.

Moreover, the conductor pattern may be, for example, substantially square, substantially rectangular, substantially rhombic, substantially n-polygonal (n is an even number), substantially circular, or substantially oval.

Other features, elements, steps, advantages and characteristics of the present invention will become more apparent from the following detailed description of preferred embodiments thereof with reference to the attached drawings.

DETAILED DESCRIPTION OF PREFERRED EMBODIMENTS

Hereinafter, preferred embodiments of a lamination type electronic component according to the present invention are described with reference to the attached drawings.

Figure 1:
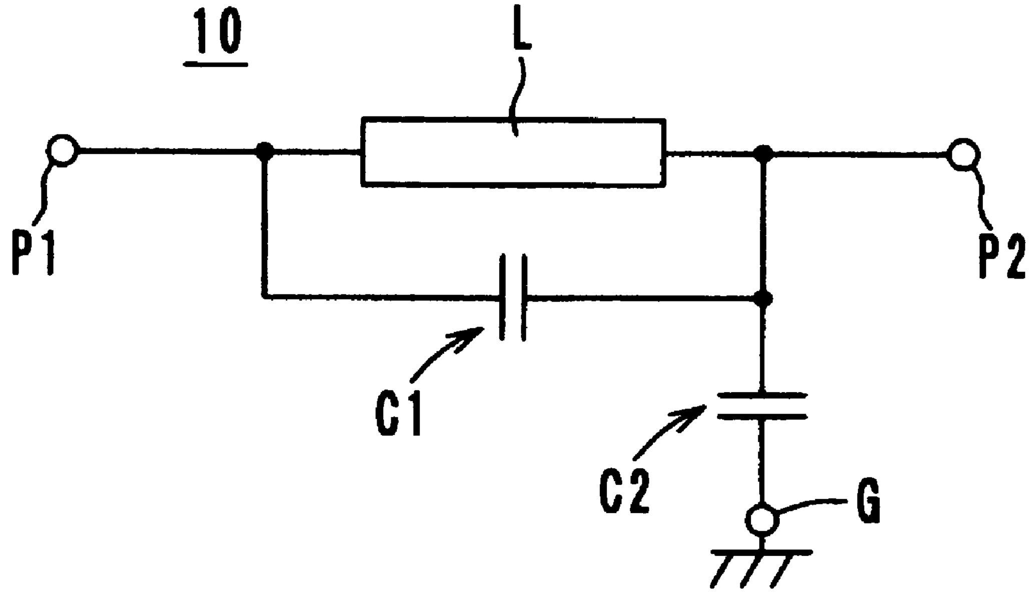
FIG. 1 is an equivalent circuit diagram of an LC filter which is an example of a lamination type electronic component.
Figure 2:
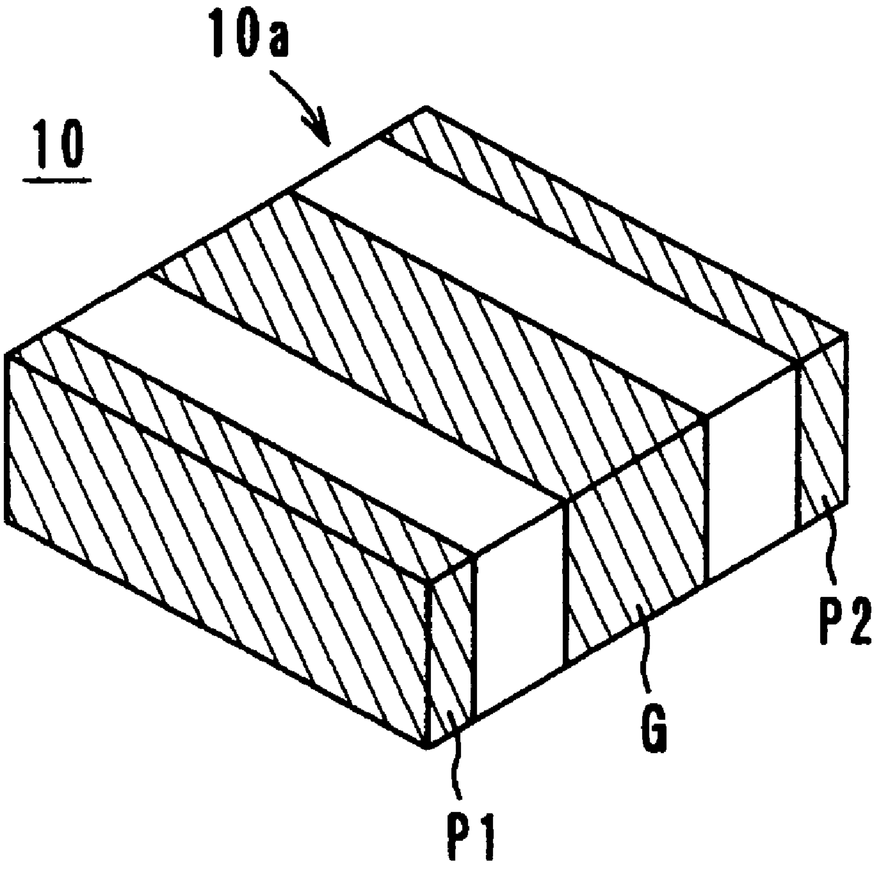
FIG. 2 is a perspective view showing the appearance of a lamination type electronic component according to a preferred embodiment of the present invention.
Figure 3:
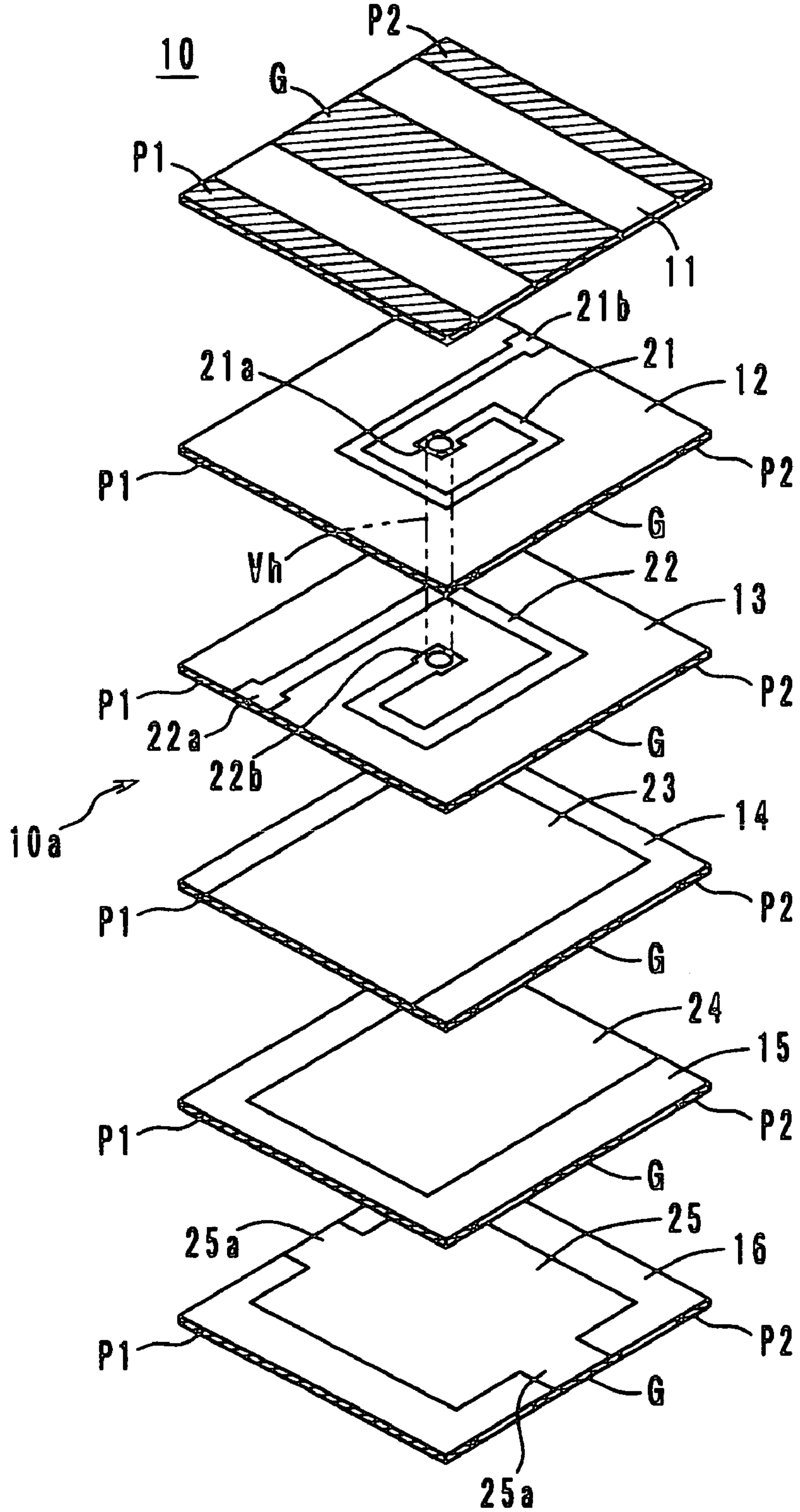
FIG. 3 is an exploded perspective view of the lamination type electronic component shown in FIG. 2.

A lamination type electronic component of a preferred embodiment of the present invention is applied to an LC filter having an equivalent circuit as shown in FIG. 1, the appearance is shown in FIG. 2, and the specific structure is shown in FIG. 3.

This LC filter 10 is preferably composed of a chip-like ceramic laminate 10*a* in which, as shown in FIG. 3, ceramic insulating layers 11 to 16 made of ceramic material are laminated. Each of the ceramic insulating layers 11 to 16 is preferably made up of a ceramic green sheet formed by a doctor blade method, a pull-up method, etc., using a ceramic material and the ceramic laminate 10*a* is formed by using the ceramic green sheets laminated and attached together by pressure and then fired.

As shown in FIG. 2, an input terminal P1 of the LC filter 10 is located at one end portion of the ceramic laminate 10*a* and an output terminal P2 of the LC filter 10 is located at the other end. Furthermore, a ground terminal G is located in the middle portion of the ceramic laminate 10*a* and between the input terminal P1 and the output terminal 2. The input terminal P1, output terminal P2, and ground terminal G may be formed by printing them on the ceramic laminate 10*a* in advance before the firing or may be formed after the firing of the ceramic laminate 10*a*.

As shown in FIG. 3, substantially square-shaped spiral conductor patterns 21 and 22, both having the same winding direction, are disposed on the main surface of the ceramic insulating layers 12 and 13, respectively. The conductor patterns 21 and 22 constitute a coil (inductor) L shown in FIG. 1 with end portions 21*a* and 22*a* electrically connected to each other by a via hole formed in the ceramic insulating layer 12.

Figure 4:
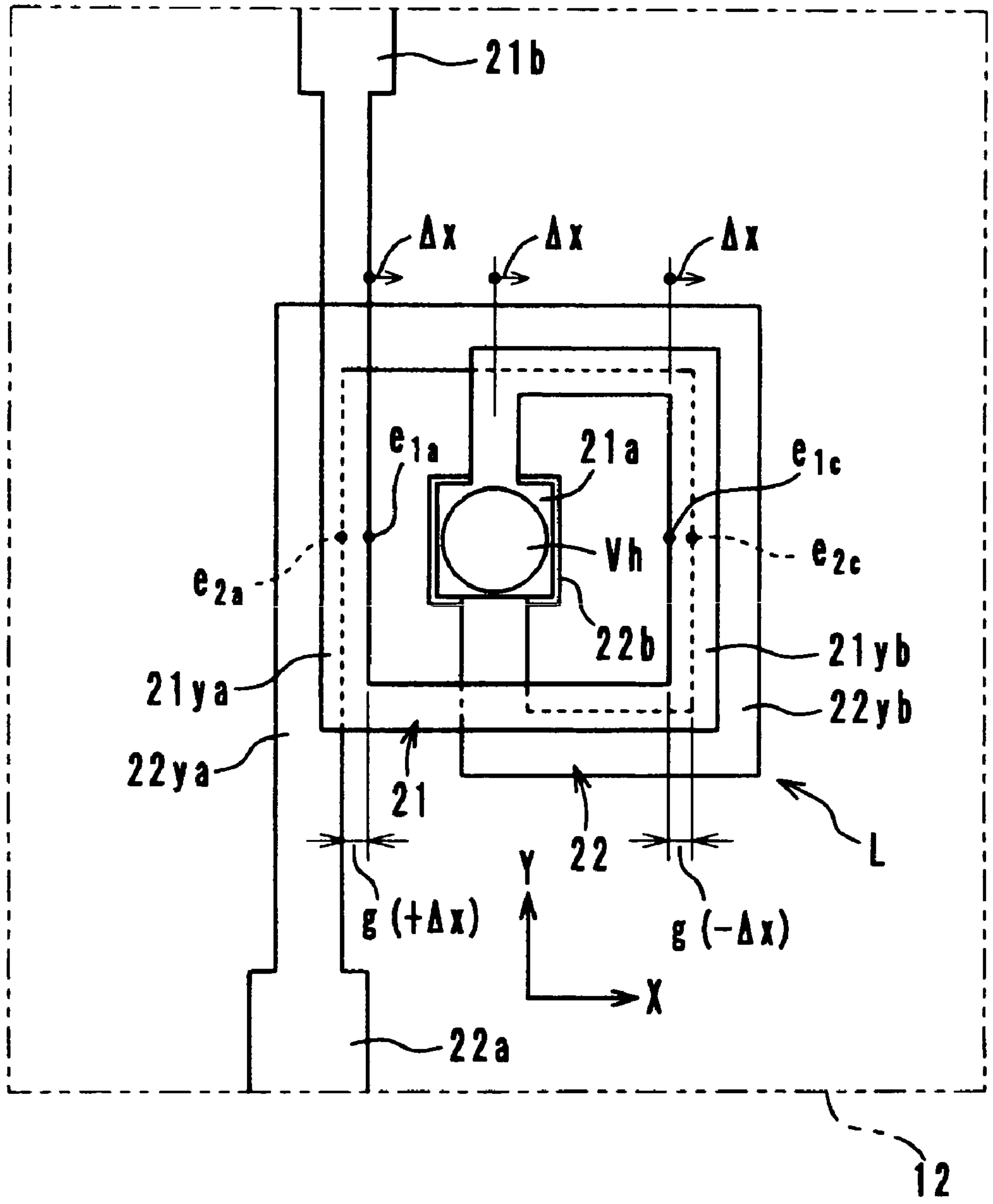
FIG. 4 shows the disposition of conductor patterns of the coil of the lamination type electronic component shown in FIG. 2.

In the present preferred embodiment, the width of the conductor pattern 21 is preferably about 100 μm, for example, and the width of the conductor pattern 22 is preferably about 150 μm, for example. The conductor patterns 21 and 22 are constructed and arranged so that, as shown in FIG. 4, when seen in the lamination direction of the ceramic insulating layers 11 to 16, the center in the width direction of sides 21_ya_ and 21_yb_ extending in the direction of Y axis of the conductor pattern 21 may be positioned at the inside edges $e_{2a}$ and $e_{2c}$ of the sides 22_ya_ and 22_yb_ extending in the direction of Y axis of the conductor pattern 22, respectively, so as to sandwich the ceramic insulating layer 12.

As shown in FIG. 3, another end portion 21_b_ of the conductor pattern 21 is led to one side of the ceramic insulating layer 12 and electrically connected to the output terminal P2. Furthermore, another end portion 22_a_ of the conductor pattern 22 is led to one side of the ceramic insulating layer 13 and electrically connected to the output terminal P1.

The capacitor electrodes 23 and 24 of a capacitor C1 constituting the LC filter 10 shown in FIG. 1 are disposed on the main surfaces of the ceramic insulating layers 14 and 15 laminated below the ceramic insulating layers 11 to 13, respectively. The capacitor electrodes 23 and 24 face each other so as to sandwich the ceramic insulating layer 14 and the capacitance generated therebetween constitutes the capacitor C1. One side of the capacitor electrode 23 is electrically connected to the input terminal P1. Furthermore, one side of the capacitor 24 is electrically connected to the output terminal P2.

Moreover, a ground electrode 25 is disposed on the main surface of the ceramic insulating layer 16 laminated below the ceramic insulating layer 15. The ground electrode 25 is electrically connected to the ground terminal G through the lead-out portions 25_a_ and 25_a_. The ground electrode 25 faces the capacitor electrode 25 so as to have the ceramic insulating layer 15 therebetween and the capacitance generated therebetween constitutes a capacitor C2 of the LC filter 10 shown in FIG. 1.

In the LC filter 10, as shown in FIG. 4, when the conductor pattern 21 is shifted in the amount of Δx in the X-axis direction from the conductor pattern 22, a pair of the sides 21_ya_ and 21_yb_ extending in the Y-axis direction of the conductor pattern 21 is also shifted in the amount of Δx in the X-axis direction from a pair of the sides 22 ya and 22_yb_ extending in the Y-axis direction of the conductor pattern 22.

Because of the shift in the amount of Δx, since the gap between the inside edge $e_{1a}$, of the coil L, the side 21_ya_ of the conductor pattern 21 and the inside edge $e_{2a}$, of the coil L, of the side 22_ya_ of the conductor pattern 22 increases from g to (g+Δx), the inside edge $e_{1a}$, of the coil L, of the side 21_ya_ of the conductor pattern 21 is more separated from the inside edge $e_{2a}$, of the coil L, of the side 22_ya_ of the conductor pattern 22. Thus, the overlap between the side 21_ya_ of the conductor pattern 21 and the conductor pattern 22 is reduced (the electric lines of force are reduced).

On the contrary, since the gap between the inside edge $e_{1c}$, of the coil L, of the side 21_yb_ of the conductor pattern 21 and the inside edge $e_{2c}$, of the coil L, of the side 22_yb_ of the conductor pattern 22 is reduced from g to (g−Δx), the inside edge $e_{1c}$, of the coil L, of the side 21_yb_ of the conductor pattern 21 approaches the edge $e_{2c}$ of the side 22_yb_ of the conductor pattern 22. Thus, the overlap between the side 21_yb_ of the conductor pattern 21 and the side 22_yb_ of the conductor pattern 22 increases (the electric lines of force increases).

Figure 10:
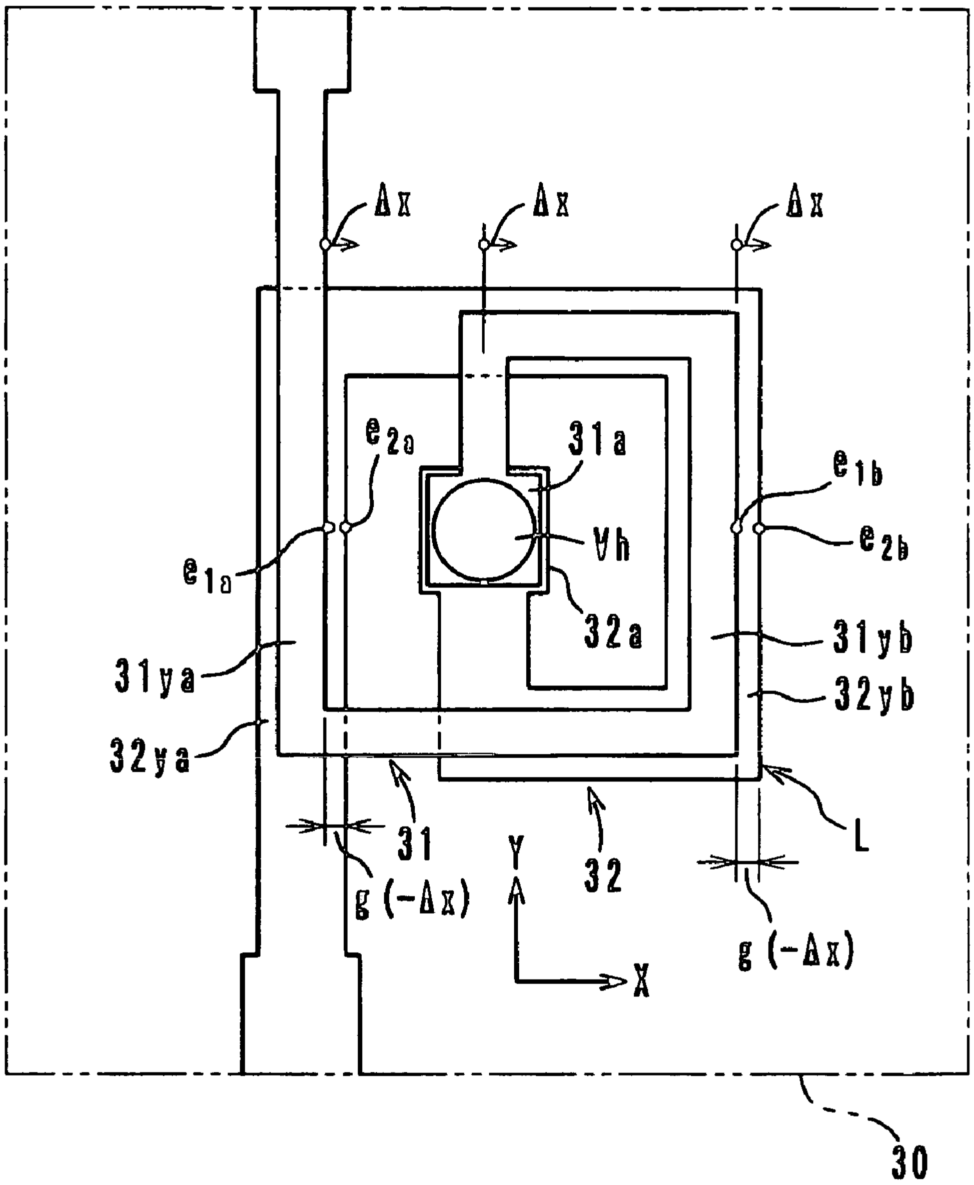
FIG. 10 shows the disposition of conductor patterns of a related lamination type electronic component.

That is, in the case where the conductor patterns 31 and 32 are stacked on each other in the related example shown in FIG. 10, when displacement between the conductor patterns 31 and 32 is caused, although the actually overlapped area between the sides 31_ya_ and 32_ya_ and the sides 31_yb_ and 32_yb_ does not change, both the reduction of the coupling electric lines of force due to the edge effect between edges $e_{1a}$ and $e_{2a}$ and the reduction of the coupling electric lines of force due to the edge effect between edges $e_{1b}$ and $e_{2b}$ reduce the impedance value of the coil L.

On one hand, when the conductor patterns 21 and 22 are overlapped in the present preferred embodiment, since one of a pair of opposing sides 21_ya_ and 22_ya_ or a pair of opposing sides 21_yb_ and 22_yb_ increases in overlapping width and then, the other decreases in overlapping width, and as a result, both offset each other, the area of the actually overlapping portion is constant. Regarding the edge effect, when the conductor pattern 21 is shifted to the right based on the conductor pattern 22, although the coupling of electric lines of force due to the edge effect between the edges $e_{1a}$ and $e_{2a}$ does not change, the coupling of electric lines of force due to the edge effect between the edges $e_{1c}$ and $e_{2c}$ is reduced. Because of this, the inductance value of the coil L is reduced.

When the related example shown in FIG. 10 and the present preferred embodiment shown in FIG. 4 are compared, in the related example, in both of a pair of the opposing sides 31_ya_ and 32_y_ and a pair of the opposing sides 31_yb_ and 32_yb_, the edge effect reduces the inductance value. However, in the present preferred embodiment, since the edge effect reduces the inductance value only in one of a pair of the opposing sides 21_ya_ and 22_ya_ and a pair of the opposing sides 21_yb_ and 22_yb_, the change of inductance value of the coil L is smaller in the present preferred embodiment than in the related example.

It is considered that the edge effect reaches three times the thickness of the insulating layer between the two conductors. For example, when the thickness of the insulating layer is about 25 μm, the edge effect reaches to about 75 μm. However, the closer to the tip, the smaller the density of the electric lines of force, and accordingly, the amount of change due to the displacement becomes smaller.

In the present preferred embodiment, since the width of the conductor pattern 21 is about 100 μm, for example, even if the conductor pattern 21 is displaced by a maximum distance of ΔX=(100/2) μm in the X-axis direction from the conductor pattern 22, it is meant that the inductance of the coil L hardly changes. This is also quite true when the conductor pattern 21 is displaced by a distance of ΔY in the Y-axis direction from the conductor pattern 22. In this way, when the conductor patterns 21 and 22 are disposed as shown in FIG. 4 variations in frequency of the attenuation pole of the LC filter 10 can be reduced.

Hereinafter, the LC filter 10 is described using specific figures. In the coil L described in FIG. 4, regarding a preferred embodiment having a coil L where the width of the conductor pattern 21 is about 100 μm and the width of the conductor pattern 22 is set to be about 150 μm, an electromagnetic field simulation was performed when the conductor pattern 21 is displaced in the X-axis direction and in the Y-axis direction from the conductor pattern 22. The result is shown in FIGS. 5 and 6, and the changes of frequency of the attenuation pole to the amount of displacement in the X-axis direction and in the Y-axis direction of the conductor pattern 21 are shown as curves $h_{1x}$ and $h_{1y}$.

Furthermore, Comparative Example 1, Comparative Example 2, and Comparative Example 3 were considered as comparative examples based on the coil L described in FIG. 10. In Comparative Example 1 having the coil L where the width of the conductor pattern 31 is about 100 μm and the width of the conductor pattern 32 is set to be about 200 μm, Comparative Example 2 having the coil L where the width of the conductor pattern 31 is about 100 μm and the width of the conductor pattern 32 is set to be about 150 μm, and Comparative Example 3 having the coil L where the width of the conductor pattern 31 is about 100 μm and the width of the conductor pattern 32 is set to be about 100 μm, an electromagnetic field simulation of the coil L was performed when the conductor pattern 31 is displaced in the X-axis direction and in the Y-axis direction from the conductor pattern 32 in the same way as the above.

Figure 5:
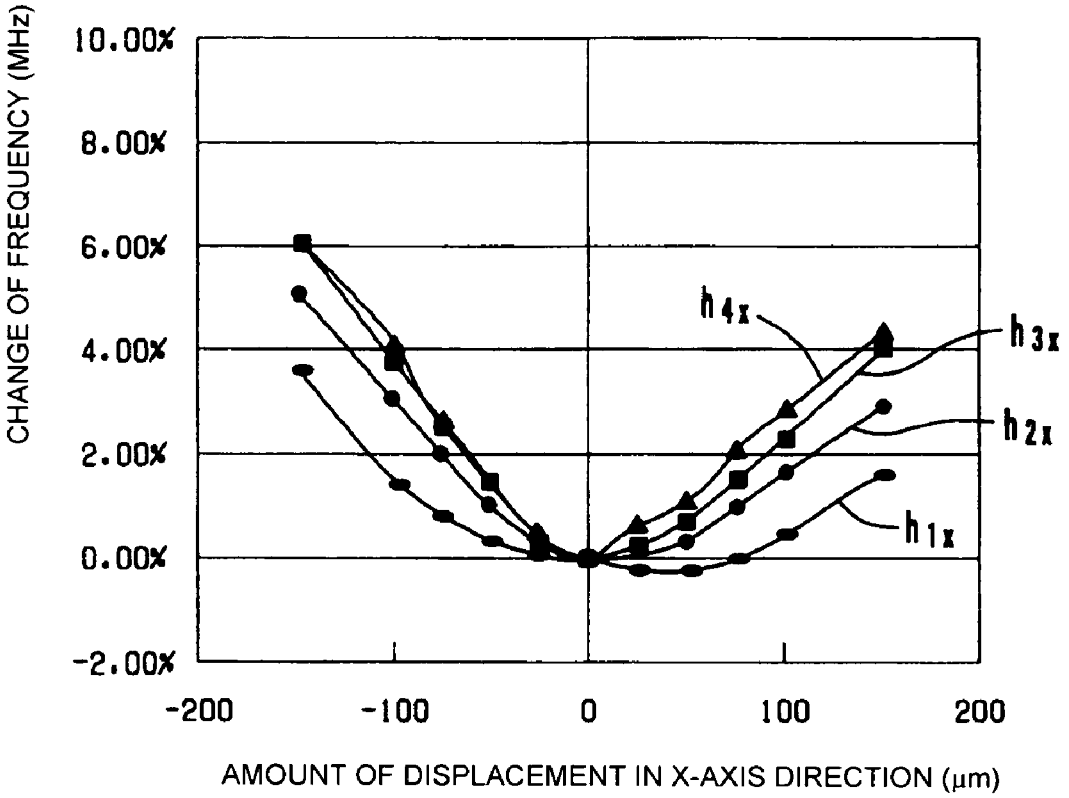
FIG. 5 is a graph showing the change of frequency of the attenuation pole of the LC filter to the displacement in the X-axis direction of the conductor pattern shown in FIG. 4.
Figure 6:
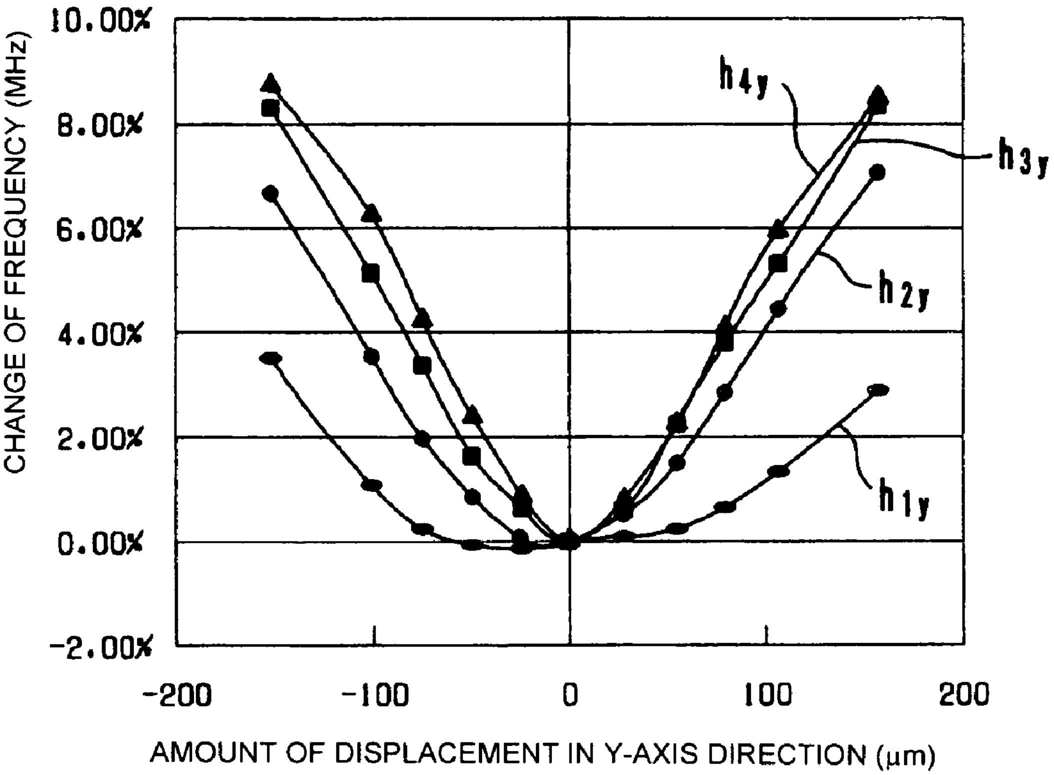
FIG. 6 is a graph showing the change of frequency of the attenuation pole of the LC filter to the displacement in the Y-axis direction of the conductor pattern shown in FIG. 4.

The result is shown in FIGS. 5 and 6 where the changes of frequency of the attenuation pole to the amount of displacement in the X-axis direction and in the Y-axis direction of the conductor pattern 31 are shown as $h_{2x}$, $h_{3x}$, and $h_{4x}$, and $h_{2y}$, $h_{3y}$, and $h_{4y}$. As is understood from FIGS. 5 and 6, the displacement of the frequency f0 of the attenuation pole of the LC filter of the present preferred embodiment is smaller than those in Comparative Examples 1 to 3.

Figure 7A:
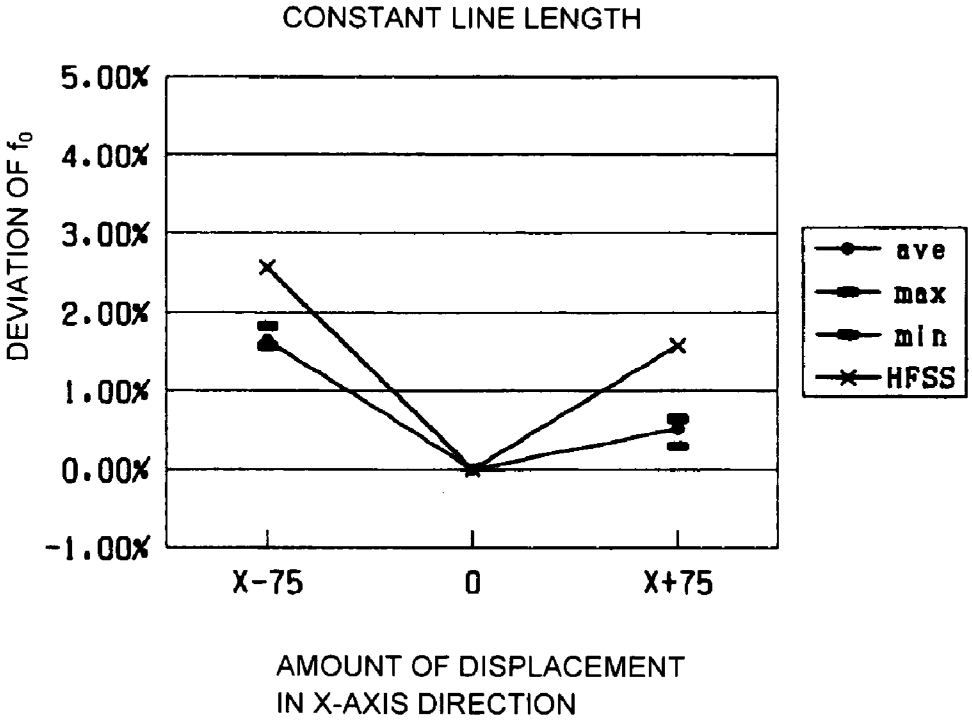
FIG. 7A is a graph showing the measurements and simulation values of frequency displacement of the attenuation pole in Comparative Examples 1 to 3 where the change of measurements and simulation values of frequency displacement of the attenuation pole due to displacement in the X-axis direction is shown.
Figure 7B:
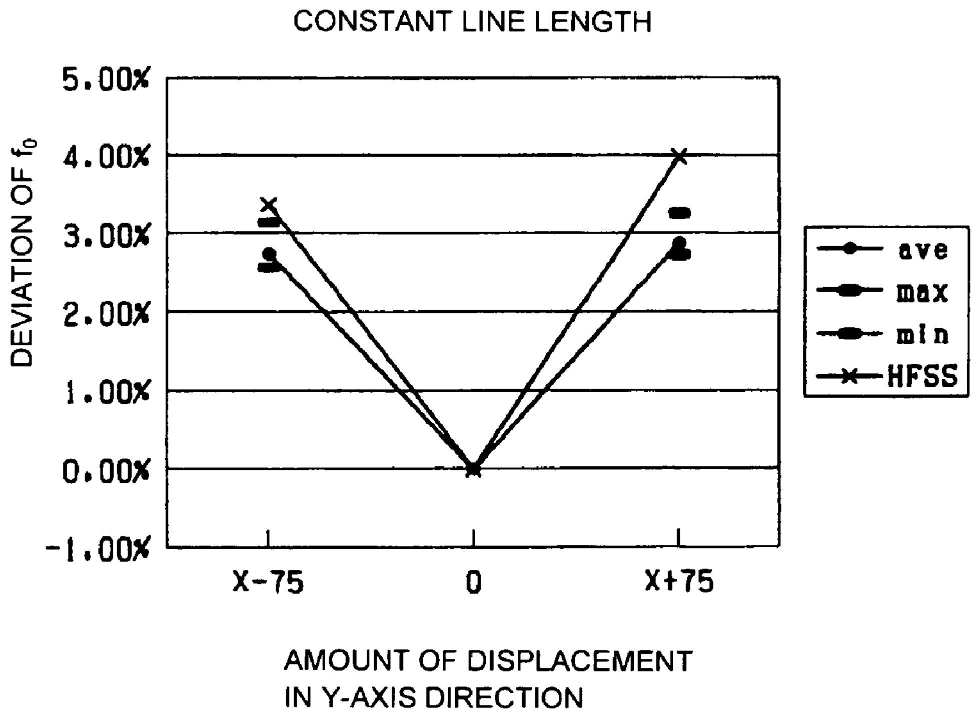
FIG. 7B is a graph showing the measurements and simulation values of frequency displacement of the attenuation pole in Comparative Examples 1 to 3 where the change of measurements and simulation values of frequency displacement of the attenuation pole due to displacement in the Y-axis direction is shown.
Figure 8A:
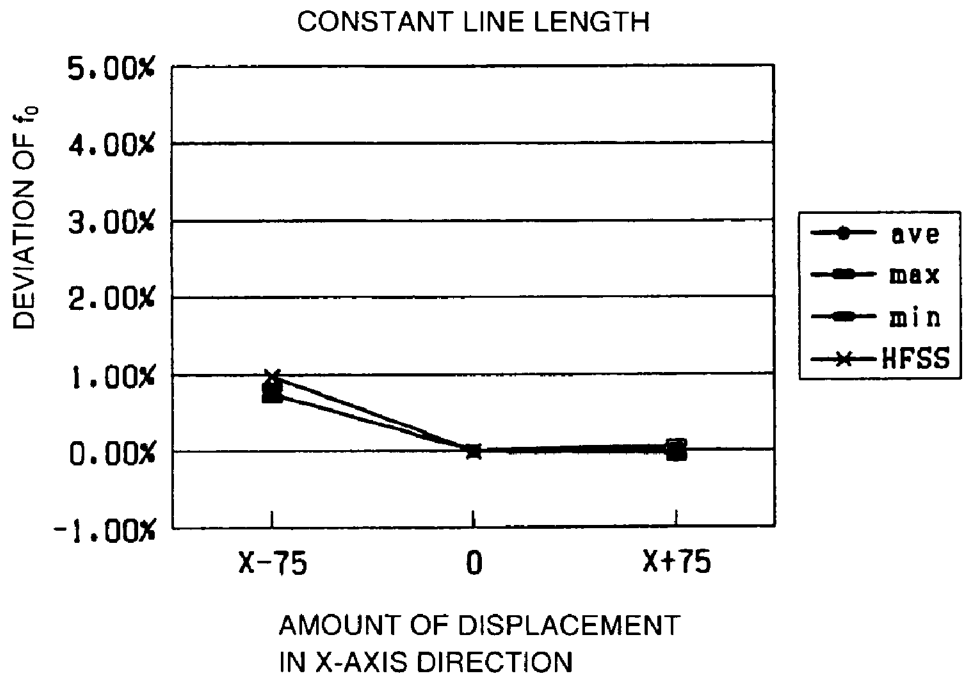
FIG. 8A is a graph showing the measurements and simulation values of frequency displacement of the attenuation pole in an embodiment where the change of measurements and simulation values of frequency displacement of the attenuation pole due to displacement in the X-axis direction is shown.
Figure 8B:
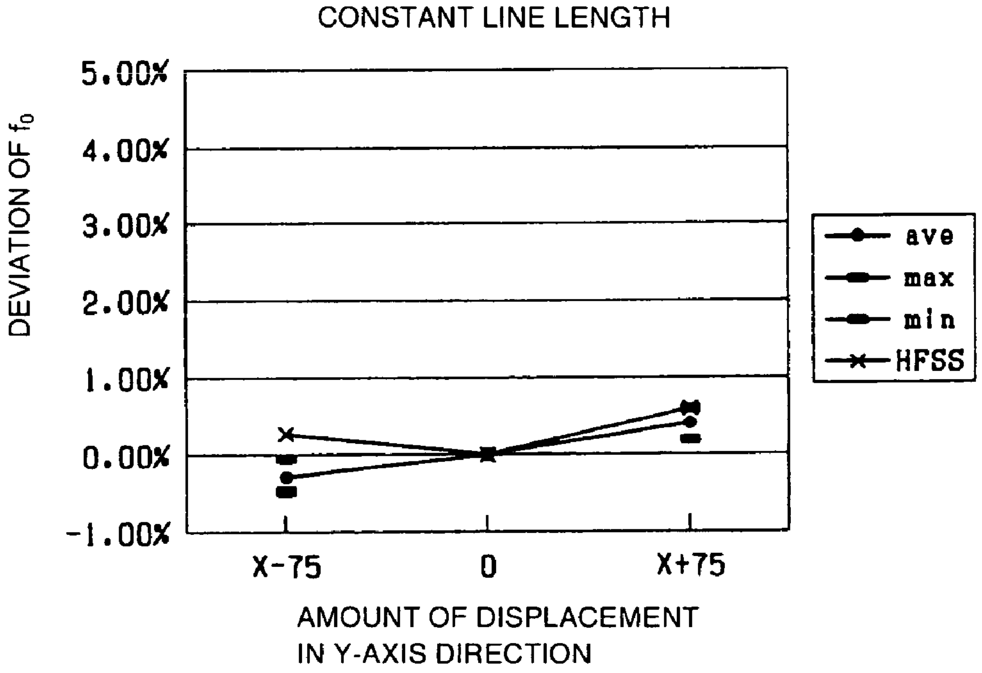
FIG. 8B is a graph showing the measurements and simulation values of frequency displacement of the attenuation pole in a preferred embodiment where the change of measurements and simulation values of frequency displacement of the attenuation pole due to displacement in the Y-axis direction is shown.

Moreover, the actual measurements of displacement of the frequency f0 of the attenuation pole of Comparative Examples 1 to 3 are shown in FIGS. 7A and 7B and the actual measurements of displacement of the frequency f0 of the attenuation pole of the embodiment is shown in FIGS. 8A and 8B. In FIGS. 7A to 8B, FIGS. 7A and 8A show average values (ave), maximum values (max), minimum values (min), and simulation values (HFSS) when the conductor patterns 31 and 32 were displaced in the X-axis direction, and FIGS. 7B and 8B show average values (ave), maximum values (max), minimum values (min), and simulation values (HFSS) when the conductor patterns 31 is displaced in the Y-axis direction.

As is understood from FIGS. 7A to 8B, the result of the electromagnetic field analyzing simulation of the coil L and the measurement result are substantially in agreement with each other, and it is understood that the above electromagnetic field simulation is substantially correctly performed.

Moreover, a lamination type electronic component according to the present invention is not limited to the above-described preferred embodiment and it can be variously altered within the sprit and scope of the invention.

For example, in the above-described preferred embodiment, the conductor pattern 21 may be disposed so that the center in the width direction of the conductor pattern 21 may come to the outside edge of the conductor pattern 22. Furthermore, although the coil L having the two conductor patterns 21 and 22 was described, a coil L having three or more conductor patterns which are connected in series through via holes may be used. Furthermore, the present invention can be used in LC filters having a coil structure which is different from the LC filter 10 having the circuit structure shown in FIG. 1.

Figure 9:
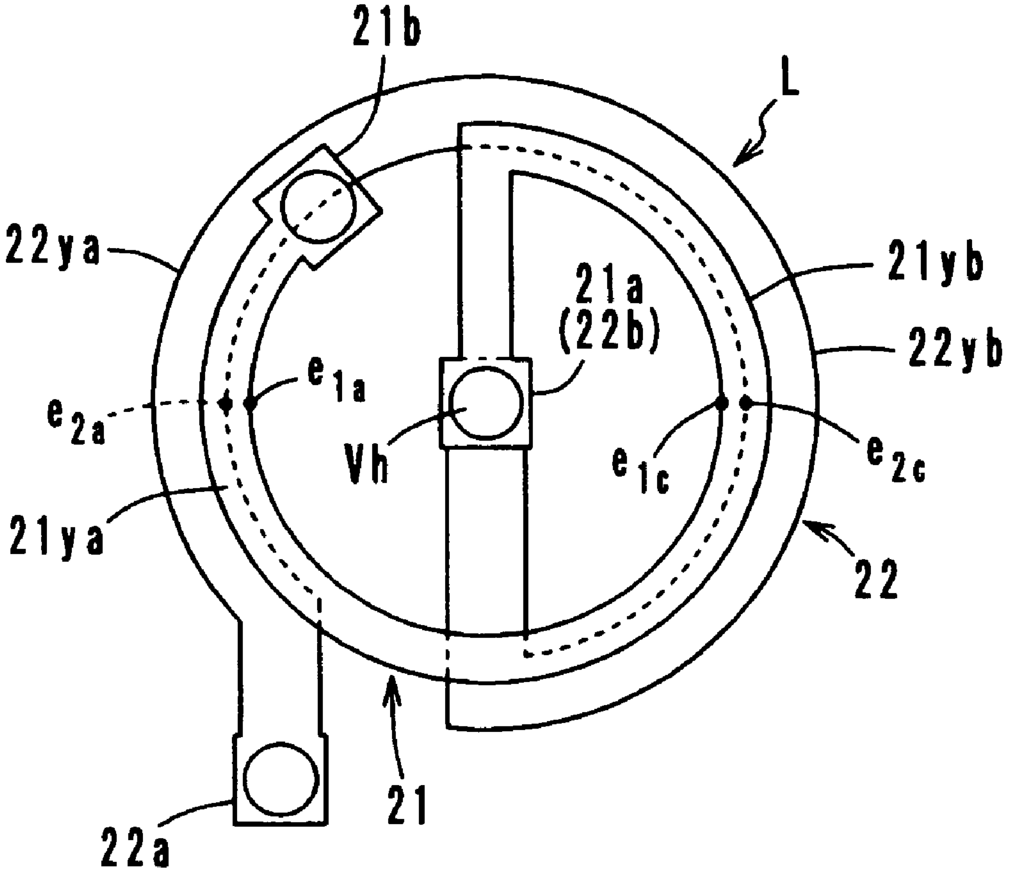
FIG. 9 shows another example of conductor patterns.

Moreover, in a lamination type electronic component according to various preferred embodiments of the present invention, the conductor pattern may be not only substantially quadrilateral (substantially square), but also substantially rectangular, substantially rhombic, substantially n-polygonal (n is an even number), substantially circular, or substantially oval. In FIG. 9, the case where the conductor patterns 21 and 22 are circular is shown. In FIG. 9, the parts and portions corresponding to those in FIG. 4 are given the same reference numerals and the parts and portions basically function in the same way as in FIG. 4.

The insulating layers constituting the laminate may be made of resin instead of ceramic.

While the present invention has been described with respect to preferred embodiments, it will be apparent to those skilled in the art that the disclosed invention may be modified in numerous ways and may assume many embodiments other than those specifically set out and described above. Accordingly, it is intended by the appended claims to cover all modifications of the invention which fall within the true spirit and scope of the invention.

What is claimed is:

1. A lamination type electronic component comprising:

a laminate having insulating layers laminated on each other in a lamination direction; and a coil having a coil axis extending in the lamination direction of the insulating layers, the coil being disposed inside of the laminate; wherein the coil includes conductor patterns having symmetrical axes that are substantially perpendicular to each other disposed on main surfaces of the insulating layers of the laminate and a via hole formed in one of the insulating layers located between adjacent ones of the conductor patterns in the lamination direction of the insulating layers, the via holes connecting the conductor patterns in series; and the adjacent conductor patterns are arranged such that, when seen in the lamination direction of the insulating layers, one of the adjacent conductor patterns is located on the inside edge or outside edge of another of the adjacent conductor patterns such that the one conductor pattern partially overlaps the another conductor pattern via one of the insulating layers.

2. A lamination type electronic component as claimed in claim 1, wherein the widths of the adjacent conductor patterns in the lamination direction of the insulating layers are different from each other.

3. A lamination type electronic component as claimed in claim 2, wherein an overlapping width between the adjacent conductor patterns in the lamination direction of the insulating layers is substantially one half a width of the conductor pattern which is narrower in width.

4. A lamination type electronic component as claimed in claim 1, wherein the conductor patterns are substantially square, substantially rectangular, substantially rhombic, substantially n-polygonal (where n is an even number), substantially circular, or substantially oval.

5. A lamination type electronic component as claimed in claim 1, wherein the insulating layers are made of ceramic or resin.

* * * * *